United States Patent

Nufer

[11] Patent Number: 5,798,469
[45] Date of Patent: Aug. 25, 1998

[54] NON-SINTERING CONTROLLED PATTERN FORMATION

[75] Inventor: Robert Wolff Nufer, Hopewell Junction, N.Y.

[73] Assignee: International Business Machines Corporation, Armonk, N.Y.

[21] Appl. No.: 486,632

[22] Filed: Jun. 7, 1995

Related U.S. Application Data

[63] Continuation of Ser. No. 375,205, Jan. 18, 1995, abandoned, which is a continuation of Ser. No. 997,808, Dec. 29, 1992, abandoned.

[51] Int. Cl.$^6$ ...................................................... B22F 7/02
[52] U.S. Cl. ........................... 75/246; 75/228; 428/548;
419/6; 419/36; 419/37; 264/56; 264/58;
264/63; 264/67
[58] Field of Search ...................... 75/228, 246; 428/548;
419/6, 36, 37; 264/56, 58, 63, 67

[56] References Cited

U.S. PATENT DOCUMENTS

| | | | |
|---|---|---|---|
| 4,340,436 | 7/1982 | Dubetsky et al. | 156/89 |
| 4,555,285 | 11/1985 | Chance et al. | 156/89 |
| 4,786,674 | 11/1988 | Herron et al. | 524/315 |
| 5,073,526 | 12/1991 | Enloe et al. | 501/96 |
| 5,085,720 | 2/1992 | Mikeska et al. | 156/89 |
| 5,130,067 | 7/1992 | Flaitz et al. | 264/60 |
| 5,250,130 | 10/1993 | Enloe et al. | 156/89 |
| 5,254,191 | 10/1993 | Mikeska et al. | 156/89 |
| 5,277,725 | 1/1994 | Ococella et al. | 156/89 |
| 5,290,504 | 3/1994 | Milkovich et al. | 264/342 RE |

*Primary Examiner*—Daniel J. Jenkins
*Attorney, Agent, or Firm*—Aziz M. Ahsan

[57] ABSTRACT

A sintered structure is formed from a powdered material by the steps of providing a first, green powdered material which can be a ceramic or metallic ceramic material. A second, preformed mold blank material to the green powdered material, wherein the preformed mold blank will not fuse with the first, green powdered material. The mold blank material is different green material having a higher sintering temperature than the first green powdered material. Then the structure is fired at the sintering temperature of the first, green powdered material; and the preformed mold blank material from the fired powdered material is removed. Grooves can be formed by pressing non-sinterable lines into a green sheet prior to firing. A wave guide unit can be formed in the ceramic. A ceramic structure can be formed with fracture markings in the green powdered material. A heat sink can be composed of sintered metallic ceramic material in the form of a spiral, while the sintered metallic ceramic material of the heat sink can ban composed of laminated layers. The heat sink can include hollow spaces formed from laminated layers. The heat sink can be in the form of a bellows formed from laminated layers of metallic ceramic material.

39 Claims, 8 Drawing Sheets

1

NON-SINTERING CONTROLLED PATTERN FORMATION

This Patent Application is a Continuation of U.S. patent application Ser. No. 08/375,205, filed on Jan. 18, 1995, now abandoned, which was a Continuation of U.S. patent application Ser. No. 07/997,808, filed on Dec. 29, 1992, now abandoned.

BACKGROUND OF THE INVENTION

1. Field of the Invention

This invention relates to packaging for microelectronic devices and more particularly to providing cavities in ceramic packages for such devices.

2. Description of related art.

In packaging of microelectronic devices, most manufacturers today produce packaging substrates 10 such as the one shown in FIG. 1 upon which semiconductor chips 11 are mounted above surface 12 inside a recessed cavity 15 so that the interconnection surface 16 of the chip 11 is level with the top surface 17 of the packaging substrate 10. This facilitates use of interconnnection decal metallurgy 13 to connect the chips 11 to terminals 14 connected in turn to conventional external circuits (not shown for convenience of illustration.) The recessed cavities 15 are usually produced by pressing or molding ceramic powder into a desired shape and firing the powder in that shape. That process is quite satisfactory for producing ordinary substrates, but is not applicable to certain varieties of glass ceramic materials, especially where zero constrained sintering processes are employed which permit considerable viscous flow. However, provision of such a chip mounting cavity having precise dimensions within a glass ceramic substrate is a highly desirable objective in the semiconductor packaging industry.

Eggerding, "Method of Sintering Large, Flat, Single Green Sheets" IBM Technical Disclosure Bulletin (July, 1983) p.616–617, teaches as follows:

"A technique has been previously described for fabricating a multilayer module using a totally thin-film approach. Individual sheets of fused quartz are used as the base on which the metals are evaporated. Holes can be laser drilled through the fused quartz for via connections. Such a technology has some long term attractiveness; however, ceramic materials other than glasses would be desirable. To form a large base of a crystalline material, one would have to either grow a large single crystal and cut it to proper size, or attempt to sinter a ceramic composition to yield a large (greater than 50 mm linear dimension), thin (250 microns or less) base. Prior attempts at forming large, thin single sheets by sintering have not been successful because the material will curl at the edges and will be extremely cambered. A potential method eliminating the camber is to use hot pressing; however, this is an expensive process, and the formation of thin samples is very difficult. Described here is a technique for making large, thin and flat sintered sheets without resorting to hot pressing."

"The proposed technique requires the use of two or more ceramic compositions that are individually tape cast to form green sheets. One ceramic composition is capable of being fully densified at the sintering temperature used. The second composition does not sinter at the temperature used, and does not react with the first ceramic composition. A laminate is formed using the two green-sheet compositions. The low sintering temperature green sheets are separated by using the high sintering temperature green sheets. The substrate, after lamination, is sintered to fully densify the low temperature composition. Because the high temperature composition has not densified, the laminate can be split along the interfaces, and large, flat, thin sintered sheets can be produced."

"An example of the above is a laminate formed using glass/ceramic green sheets and 100% $Al_2O_3$ green sheets. The glass ceramic green sheets can be used as is, or they can be punched to yield a via pattern prior to lamination. The individual glass ceramic sheets are separated by one or more $Al_2O_3$ sheets. The laminate is then sintered at 950° C. for two hours. The glass ceramic fully densifies, while the $Al_2O_3$ shows very little, if any, shrinkage. The $Al_2O_3$ sheet has, in essence, become powder because the organic binder has been removed. The laminate can then be easily split to yield a sintered sheet of glass ceramic. Sintered sheets having dimensions of $\approx 150$ mm$\times$150 mm, and thicknesses of 100–150 microns, have been formed, with and without a via pattern punched prior to lamination. The technique can be used with other materials. Also, the technique can be used to prepare thin sheets of partially sintered ceramics. The residual connected porosity left in the microstructure would allow the material, after sintering and separation, to act as a filtration medium."

U.S. Pat. No. 5,130,067 for "Method and Means for Co-Sintering Ceramic/Metal MLC Substrates" of Flaitz, Nufer et al. shows that cerium oxide may also be utilized in connection with coextensive pressure sintering as described in connection with FIG. 4 of Flaitz et al. There, the cohesive forces generated during sintering are overcome by use of a Z-direction force. As illustrated, the substrate, is fired with a coextensive platen on its surface. A porous platen is chosen to provide sufficient Z-direction force (the weight of the platen), to overcome the cohesive forces in the sintering substrate. The platen may be composed of a prefired ceramic, such as alumina ($Al_2O_3$), or other high temperature material which will not sinter or fuse to the substrate. Porosity of the coextensive platen is essential in order to provide the necessary atmospheric access for binder burn-off. The porous platen may be made of cerium oxide or coated with same to enhance the burn-off step by utilizing the solid-state diffusion properties of cerium oxide. The coextensive platen provides not only the Z-direction force needed to prevent X-Y shrinkage, by overcoming the cohesive forces, but also provides a uniform force to prevent cambering of the substrate. Furthermore, in the instance of firing a ceramic substrate having metallurgy containing vias, the presence of the platen over the surface of the vias as well as the substrate will act to limit the via bulge experienced. When using a coextensive platen the bottom surface of the sintering article must also be contacted. As illustrated in FIG. 4 of Flaitz et al, the ceramic article is placed on a setter tile. It is, again, preferable that the setter tile used also be porous, possibly of a porous cerium oxide composite, or be provided with the channels of FIG. 1 of Flaitz et al, in order to facilitate burn-off.

The force required for conformal pressure sintering is chosen to be sufficient to prohibit X-Y distortion camber and via bulge, and control densification in the Z direction, but yet not sufficient to cause a total expansion of the substrate. FIG. 6 of Flaitz et al, shows the coextensive frictional approach to the shrinkage problem wherein contact sheets are laminated onto the article to be sintered, and the sintering takes place with or without the use of additional weights. Contact sheets in FIG. 6 of Flaitz et al, composed of porous green sheets of alumina or glass, or precrystallized glass/ceramic, are laminated onto the surfaces of the ceramic article, before firing. Again, the composition of the material which is in contact with the ceramic must be such that it will not fuse to the ceramic. In addition, the contact sheet composition is chosen to be a material which is continuously porous; is thermally stable so that it will not undergo any shrinkage or expansion under the conditions of the ceramic sintering cycle, and, has continuous mechanical integrity/rigidity. The appropriate contact sheets maintain their dimensions during the ceramic firing cycle and necessarily, therefore, physically restrict the ceramic from shrinking. The laminated contact sheet-ceramic sandwich can then be placed on a setter tile, preferably a porous tile, and fired. After the sintering and crystallization of the ceramic have been completed, the contact sheets are removed from the ceramic surfaces by use of an appropriate removal process which will not damage the surfaces of the ceramic, such as polishing, scraping, etc.

U.S. Pat. No. 4,555,285 of D. Chance et al for "Forming Patterns in Metallic or Ceramic Substrates" employs a photoresist or other fugitive or labile polymeric materials to define cavities or patterns in a MLC or ceramic structure. These material being labile decompose and volatilize in the early stages of the sintering cycle. Although the polymeric material define the pattern in a ceramic, that is where the similarity ends. Once the labile polymer no longer exist the normal sintering forces can result in the collapse of these cavities. This is particularly the case when sintering materials such as our Glass/Ceramic where the ceramic undergoes considerable flow, particularly during Zero/constrained shrinkage where the particles sinter in the Z-direction. In this instance any cavity that would be formed using a fugitive material would disappear or be significantly deformed. The Chance et al teaching is significantly different and is not functional relative to our invention.

In the prior art the polymer used for forming the cavity only defines that shape during lamination and not during the critical sintering process where the ceramic can flow and deform.

THE PROBLEM

Forming molded patterns in glass ceramic packages for chips is difficult since the usual way of pressing ceramic powder into a shape and firing does not work with glass ceramic materials.

Most substrate manufacturers produce substrates on which semiconductor chips or devices are mounted in a recessed cavity so that the surface of the chip or device is level with the substrate surface. This facilitates the interconnection of the chip with other devices using decals as described above in connection with FIG. 1.

These recessed cavities are usually produced by pressing or molding ceramic powder into the desired shape and firing. This process works quite well for producing most substrates, but is not a process that is adaptable to firing glass ceramic materials, particularly where zero constrained sintering is employed where considerable viscous flow is experienced.

It is an object of this invention to provide a means for defining a shape during lamination and during the critical sintering process to prevent the ceramic from flowing and deforming.

In accordance with this invention one uses a non-sinterable material to define a configuration which may include a cavity and to provide a supporting structure that guarantees the shape and size of a cavity. The non-sinterable material remains during the entire sintering process and is removed only after the entire ceramic structure is totally sintered.

The non-sinterable patterning technique is applicable to all ceramic materials but has a particular advantage where pressure sintering is employed as in the case of glass/ceramic or even flattening of other ceramic structures.

Providing a precise cavity in a glass ceramic product can be done by incorporating a non-sinterable material, such as alumina, of a desired shape or configuration. Since this non-sinterable material is non-sinterable at the glass/ceramic sintering temperatures it will form and retain the shape of the glass/ceramic during sintering, yet is easily removed following sintering. The unsintered alumina can be removed with water or ultrasonic agitation since it remains as a packed powder that will flake apart and be suspended in water. The alumina powder is analogous to dried mud that forms a hard cake, but can be redistributed easily and suspended in water by imparting some form of agitation thereto.

BRIEF DESCRIPTION OF THE DRAWINGS

The foregoing and other aspects and advantages of this invention are explained and described below with reference to the accompanying drawings, in which:

FIG. 2A shows mold blanks formed by punching holes in green sheets of glass ceramic material.

FIG. 2B shows those holes filled with pure aluminum oxide and binder.

FIG. 2C shows a plurality of filled ceramic green sheets of the kind shown in FIG. 2B but of varying patterns laminated together with the different green sheets punched with varying patterns.

FIG. 2D shows the fired, now monolithic laminated, glass ceramic substrate resulting from the sintering leading to fusion of the laminated layers of glass ceramic material as shown in FIGS. 2C.

DESCRIPTION OF THE PREFERRED EMBODIMENT Mold Material and Mold Blank Material The process of this invention commences with a mold material-and a mold blank material suitable for use in manufacturing. I have found that it is desirable to use a sinterable mold material such as glass ceramic green sheet material in combination with a non-sinterable mold blank material which can be easily removed following sintering by a process such as agitation and dispersal.

A. A mold blank of a non-sinterable material such as alumina is placed in locations in the package where each cavity is required.

(i) The mold blank can be in the form of a sheet, a strip of material, a fragment of material, or a solid block, or a dried paset made from particulate material.

(ii) Alternative mold blank materials include alumina (aluminum oxide), silicon nitride, boron nitride, aluminum nitride, tungsten, molybdenum, etc.

B. The non-sintered mold blank material (alumina, etc.) is then removed subsequently. In the case of alumina, placing the package in water causes the aluminum oxide to flake off and lie suspended in the water. Agitation of the water facilitates removal of the mold blank. Following sintering the mold blank material is removed by impingement with water, etc. and/or ultrasonic agitation during suspension in a dispersant such as water.

This process can be practiced by punching or machining a glass ceramic sheet or the like with a set of desired shapes. By machining several adjacent sheets with similar patterns, cavities with variable depths can be formed. Then the cavities in the green sheets are filled with a pure alumina green sheet material. The multilayered ceramic (MLC) stack is then laminated and fired in the manner well known to those skilled in the art. Normal substrate metallization prevails in the remaining portion of the sheets which are laminated, as desired. Several practical applications of the above process steps are illustrated in FIGS. 2A–2C which are isometric cross-sections of green sheets and FIG. 2D shows the fired substrate made by the process illustrated in part by FIG. 2C.

Figure 2A:
FIGS. 2A–2C show isometric cross-sections of green sheets and FIG. 2D shows a fired substrate made in accordance with this invention.

In FIG. 2A, a mold blanks is formed by punching a hole 21 in a green sheet 20 of glass ceramic material.

Figure 2B:

As shown in FIG. 2B the hole 21 is filled with pure aluminum oxide material 22 ($Al_2O_3$, i.e. alumina.)

Figure 2C:
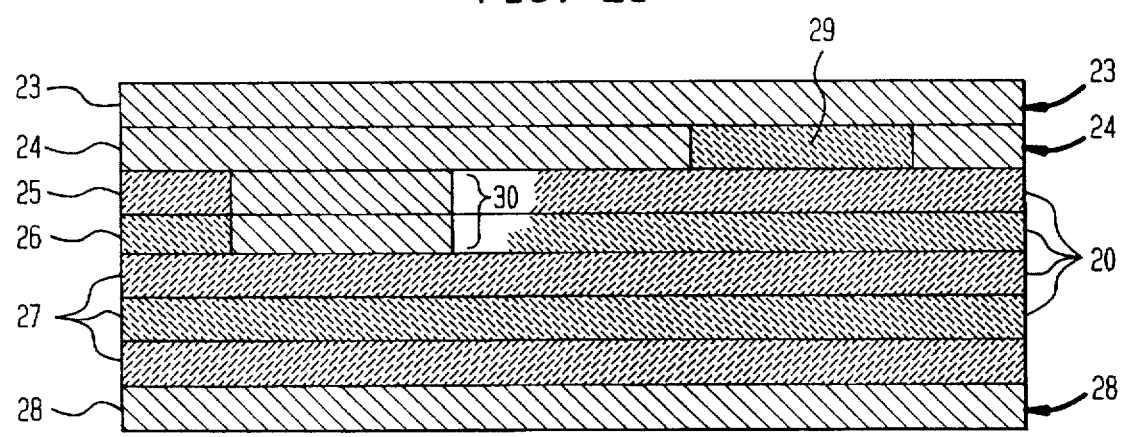
Figure 2D:
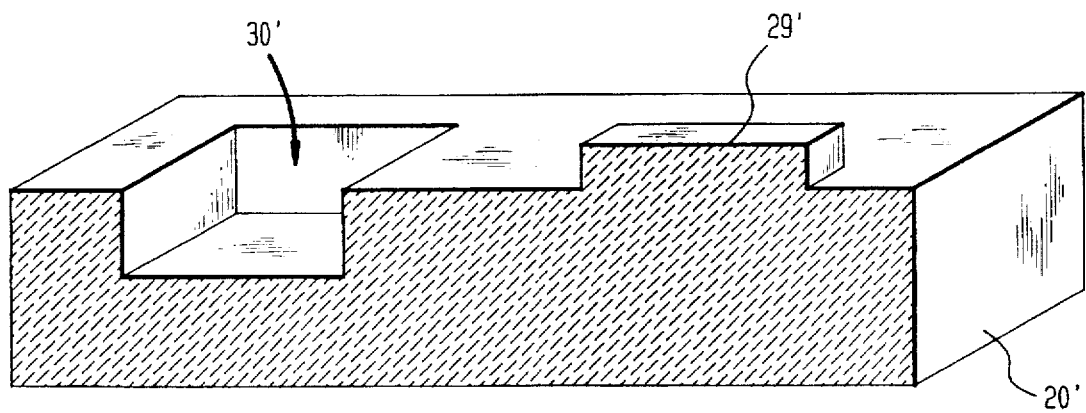

FIG. 2C shows a plurality of filled ceramic green sheets 20 of the kind shown in FIG. 2B but of varying patterns laminated together. The different green sheets 20 are punched with varying patterns as can be seen in FIG. 2C where the top layer 23 is all alumina, the second layer 24 is mostly alumina with a small glass ceramic pattern 29 and the third and fourth layers 25, 26 are identical to the layer shown in FIG. 2B, which include a pair of holes 21 filled with alumina 22 to form a structure 30 of alumina. The next three layers 27 (five, six and seven of eight) are composed of pure glass ceramic. The bottom layer 28 is like the top layer 23, composed of pure alumina.

FIG. 2D shows the fired, now monolithic laminated, glass ceramic substrate 20' resulting from the sintering leading to fusion of the laminated layers of glass ceramic material as shown in FIG. 2C. The resultant structure has personalized features. For example, a cavity 30' is formed where the pattern 30 of alumina was located. As shown in FIG. 2D, a raised feature 29' is formed where structure 29 of glass ceramic was formed in layer 24 of FIG. 2C. The alumina is easily removed as it does not sinter or adhere to the fired glass ceramic.

The mold blanks in FIGS. 2A–2C used to form structures such as in FIG. 2D can be shaped/machined by punching, laser or E-beam machining of a green ceramic material and then filling the shaped/machined green ceramic material with the mold blank material where the ceramic has been removed.

In a structure such as that shown in FIG. 2D when circuit metallization is incorporated, it can be incorporated along with the personalized cavities and raised features.

The basic concept of FIGS. 2A–2D can be employed to make numerous kinds of shapes such as microelectronic chip cavities, grooves for seals such as an O-ring, etc.

Figure 3A:
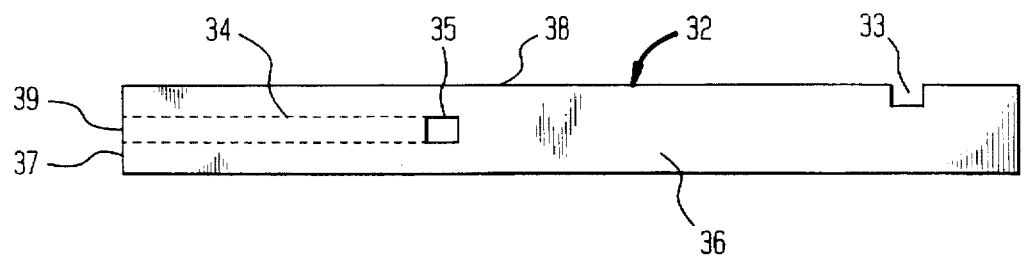
FIGS. 3A and 3B are front elevation and plan views of a fired glass ceramic structure showing how the invention can be employed to form hollow internal channels for applications such as fiber optics, lines for metallurgical lines, etc., using the process of FIGS. 2A–2D to form a solid glass ceramic structure from a plurality of laminated green sheets.
Figure 3B:
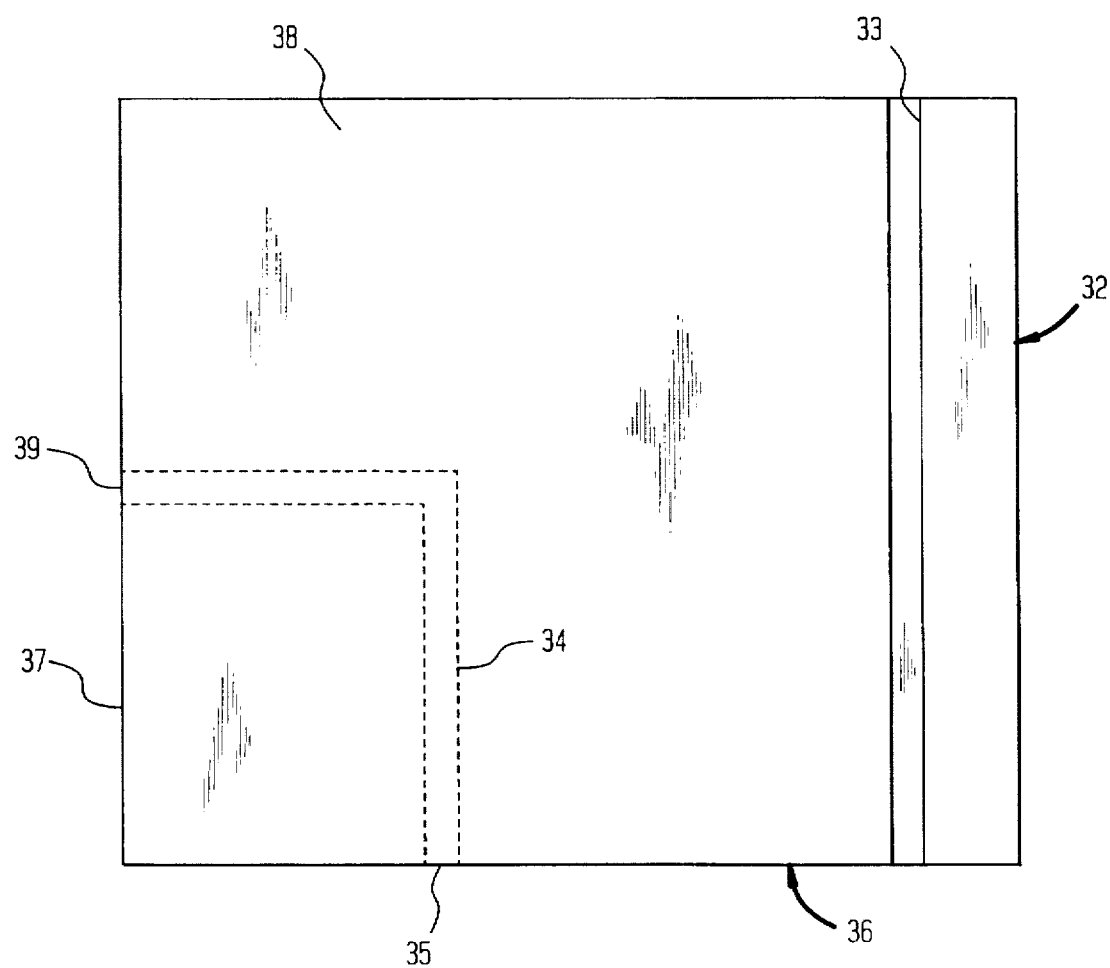

In fact the basic concept can be used to produce internal channels, as shown in FIGS. 3A and 3B, where the invention is employed to form internal channels for applications such as fiber optics, lines for metallurgical lines, etc. Using the process of FIGS. 2A–2D to form a solid glass ceramic structure from several laminated green sheets, hollow spaces 34 within a structure can be formed as illustrated in FIGS. 3A and 3B which are front elevation and plan views of a fired glass ceramic structure 32. Subsequently the hollow spaces 34 can be filled with polymeric material to form a fiber optic waveguide, i.e. an optical transmission path. The hollow tunnel 34 within structure 32 has an inlet 35 in the front 36 and an outlet 39 on the left 37. In addition, a groove 33 is formed on the top 38 of structure 32 by leaving a groove of alumina or the like in a pattern on the top layer of glass ceramic material during firing of the glass ceramic. These channels can be formed providing paths in any direction, e.g. along any of the x, y and z axes.

Figure 4A:
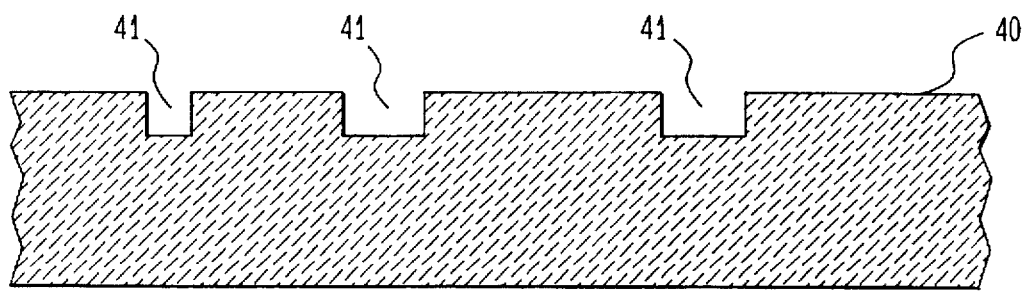
FIGS. 4A–4C show how metallurgical line grooves can be formed by pressing non-sinterable mold blank lines into a glass ceramic sheet, or by filling a machined groove formed by machining with an energy beam from either a laser or E-beam machine. The energy beams forms a groove or line which is later filled with a non-sinterable paste analogously to the above.
Figure 4B:
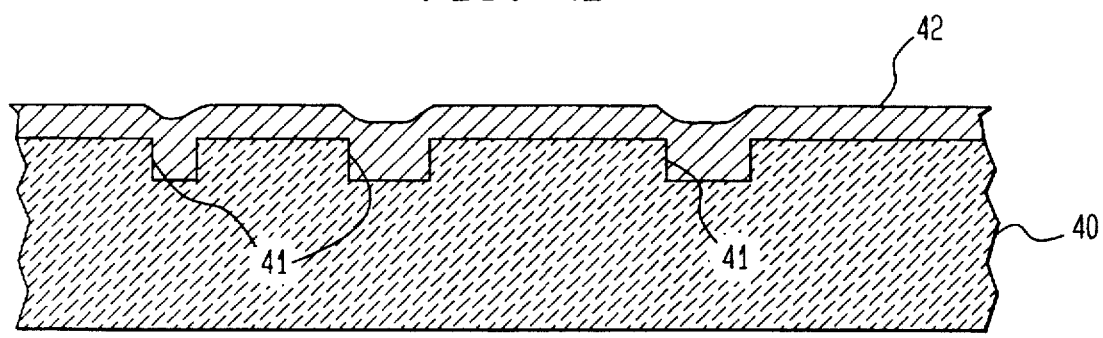
Figure 4C:
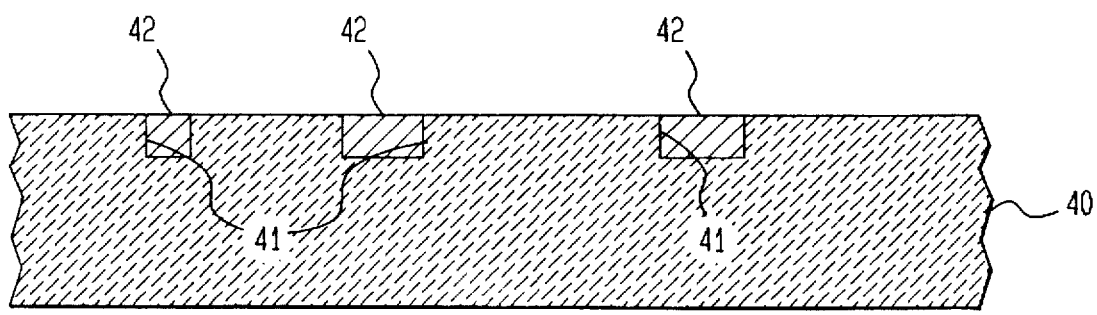

An alternative use of the basic concept is to make metallurgical lines. In the case of the creation of grooves on the surface of the ceramic, these grooves can be filled by plating or blanket evaporation of the desired metallurgy. The lines can be selectively plated or in the blanket metallization technique the entire surface can be metallized and the raised portions removed by polishing, etc. yielding the desired personalization surface as shown in FIGS. 4A–4C.

Metallurgical line grooves can be formed by pressing the non-sinterable lines into a glass ceramic sheet, or by later filling either laser or E-beam machine groove or line with a non-sinterable paste. The process yields lines such as those shown in FIGS. 4A–4C, which show a method of using the grooves formed first in the sintered material grooves illustrated in FIG. 4A and filling them with metal later as shown in FIG. 4B. This yields the kinds of lines shown in FIG. 4C.

The grooves can be formed by using and energy beam machine such as a laser or E-beam machine. In that case, next in a step not illustrated here, the grooves formed are filled with a non-sinterable paste as described above in connection with FIGS. 2A–2C and then they are fired to produce the fired ceramic substrate of FIG. 4A.

Alternatively, in the case of metallurgical lines, grooves can be formed by pressing the non-sinterable lines into a glass ceramic sheet. In such a case conductors are formed by pressing the pattern of the circuit in the form of a mold blank into the surface of a green glass ceramic sheet and then the green ceramic is fired again to produce the substrate 40 of FIG. 4A with grooves 41. Later one adds the metallization where the mold blank has been removed in accordance with this invention.

In FIG. 4B, the metal 42 is deposited into grooves 41 and onto the rest of the top of fired ceramic substrate 40. This can be done by blanket plating or blanket evaporation of the desired metallurgy. Alternatively, the lines can be selectively plated or selectively evaporated.

In the case of blanket plating or blanket evaporation the surplus metal extending above the surface of the substrate 40 can be removed by polishing, etc. to produce the planarized surface as shown in FIG. 4C. In the case of such polishing, the surplus metal 42 is removed by a conventional planarization technique exposing the personalized metal lines 42 in grooves 41 on the top surface of substrate 40.

Figure 5A:
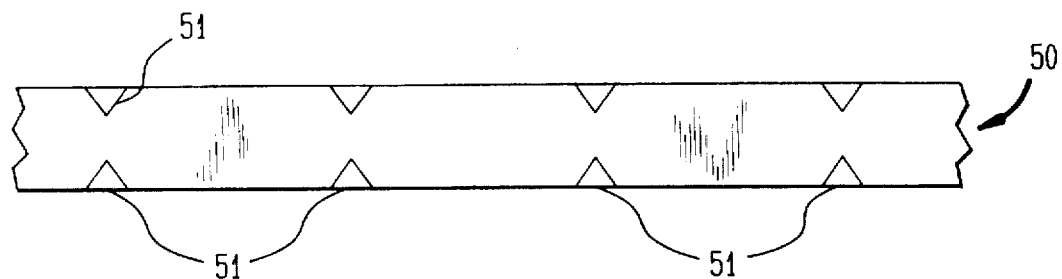
FIGS. 5A–5D are sectional and perspective views showing how the non-sinterable material can be incorporated as a material that will provide either holes or surface grooves in the finished substrate to serve as a fracture point on a snap laminate format and broken into individual parts following sintering.
Figure 5B:
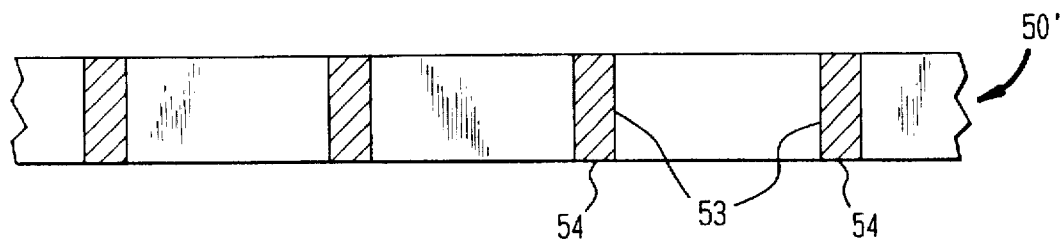
Figure 5C:
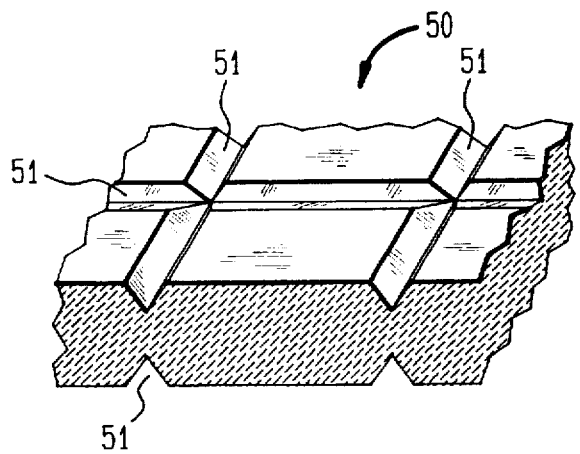
Figure 5D:
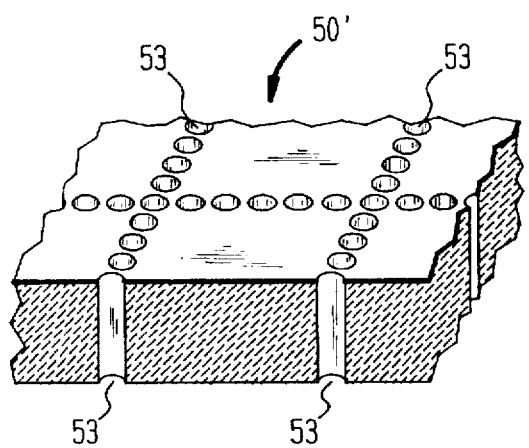

Referring to FIGS. 5A–5D, in addition to using the non-sinterable material to create of cavities, grooves or optical communication, metallurgy, the non-sinterable material can be incorporated as a material that will provide either holes or-surface grooves in the finished substrate so that it can serve as a fracture point on a snap laminate format and broken into individual parts following sintering. This is easily adaptable to the glass/ceramic substrate and can be created using punched holes along the fracture line and then filling with the non-sintering paste or screening a line or providing a groove that is filled with the alumina green sheet as shown in FIGS. 5A–5D. There patterns can be formed in a larger glass ceramic substrate 50, or 50' including a number of elements to be snapped apart by placing the mold blank material into the glass ceramic material in a V-groove fashion as in FIGS. 5A and 5C or in broken line fashion as in FIGS. 5B and 5D so that the pattern produced provides a fracture line with faults permitting a straight line snapping of the fired ceramic material so the laminate can be broken into individual parts following sintering. In FIG. 5A, a series of grooves 51 have been impressed in the green ceramic material 50. The grooves 51 are filled with alumina (non-sintering filler) for the purpose of holding the grooves until the glass ceramic material has been fired. Then the alumina is removed resulting in the snap substrate 50 in FIG. 5C. In FIG. 5B, the substrate 50' has been drilled in a row of punched holes 53 which have been filled with alumina 54 until the firing is finished yielding the structure of FIG. 5D with the holes aligned for easy snap fracture of the fired substrate 50' along the line marked by the row of holes 53.

Figure 6A:
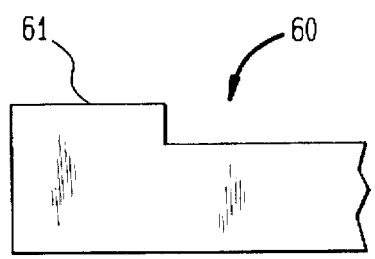
FIGS. 6A–6C show exemplary firing options for the glass ceramic material such as a raised shoulder in the body shown in FIG. 6A, an O-ring groove in the body in FIG. 6B and a cavity in the body in FIG. 6C.
Figure 6B:
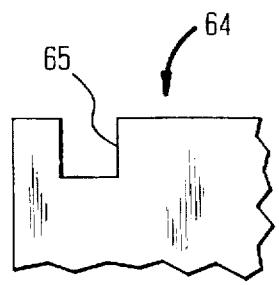
Figure 6C:
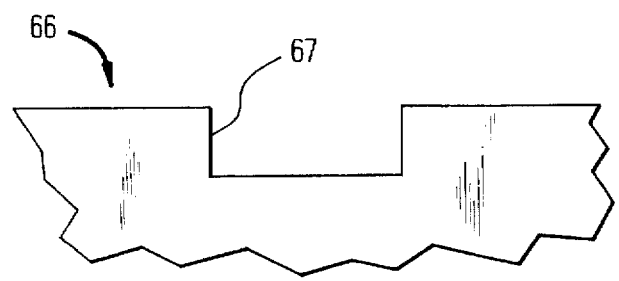

FIGS. 6A–6C show exemplary firing options for the glass ceramic material such as the raised shoulder 61 in body 60 of FIG. 6A, the O-ring groove 65 in body 64 of FIG. 6B and the cavity 67 in body 66 in FIG. 6C.

Figure 1:
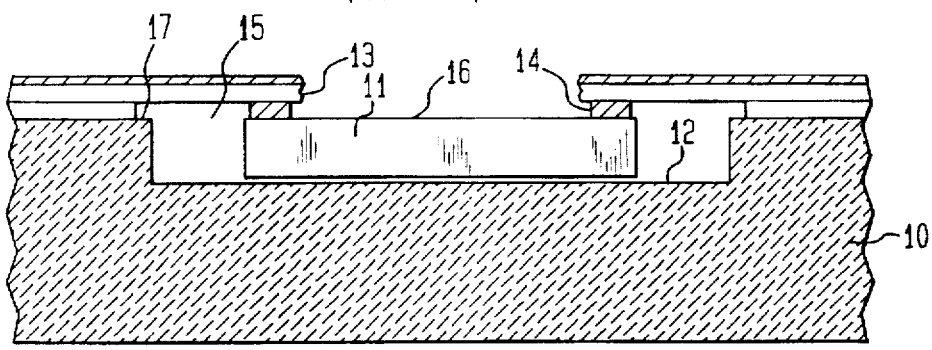
FIG. 1 shows a prior art package for mounting semiconductor chips inside a recessed cavity in a packaging substrate so that the interconnection surface of the chip is level with the top surface of the packaging substrate.
Figure 7:
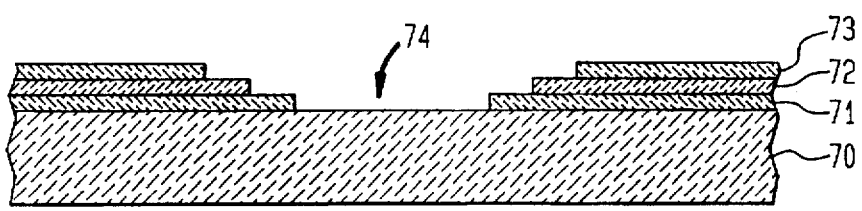
FIG. 7 shows a structure formed using a substrate of glass ceramic with layers thereon formed by non-sinterable materials to form a several tiered structure of stacked planes forming a flaring opening for wiring in each of the planes.

FIG. 7 shows a structure formed using a substrate 70 of glass ceramic with layers thereon formed by non-sinterable materials to form a several tiered structure of stacked planes 71, 72, 73 forming a flaring opening 74 with wiring in each of the planes. This is very important in forming various recessed cavities for products in glass/ceramic alumina and other ceramic materials.

Figure 8:
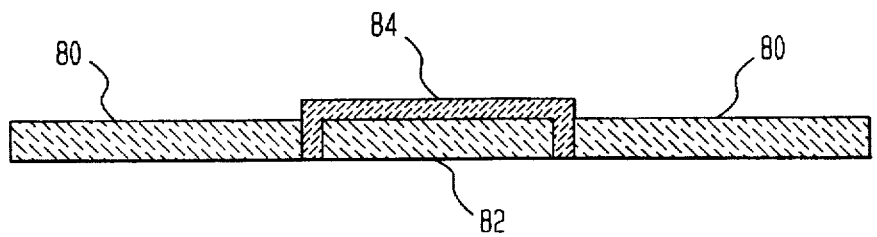
FIG. 8 shows an alternative to the concept of using non-sintering inserts per se. An insert can be employed which is generally composed of identical material.

FIG. 8 shows an alternative to the concept of using non-sintering inserts, per se. Use of non-sintering inserts will work well, but an alternative method of forming the structures in accordance with this invention is to use as an insert 82 generally composed of identical material to a green sheet 80 which has an opening into which insert 82 is placed. In addition one screens a very thin release layer 84 of non-sintering material at the interface or on the surface of that insert 82. An insert 82 can be employed which is of identical material. A screened paste 84 is deposited upon the top surface of insert 82 and at the interface between the sheet 80 and the insert 82. In this situation, the insert 82 would have the same basic sintering properties as the bulk ceramic material 80 but it would be separated therefrom by the very thin release layer provided by fired paste 84, thereby allowing for the formation of the cavity and the removal of the insert 82 following sintering. By simultaneously screening the insert 82 into the bulk sheet one can provide the release layer and also affix the insert 82 into the green sheet. The paste 84 is non sinterable and thus it provides a release of the insert from the sheet 80 once it and the insert 82 have been fired. The purpose of using the insert 82 of identical material is to eliminate distortions caused by the shrinkage of the material, particularly when non glass ceramic materials which shrink three dimensionally are used. The different layers that form the ultimate stepped cavity for example can be laminated together, after screening. This can be done in sequential layers to form a larger cavity and yet to maintain uniform shrinkage.

The insert 82 or non-sintering segment during screening can be located and held in place by vacuum or be lightly bonded to a polyethylene terephthalate (Mylar) film together with the green sheet during screening. The insert of comparable material insures comparable shrinkage properties to the bulk ceramic and minimized distortions, warpage, etc.

An example of the instant invention is a laminated sixty-three layer glass ceramic substrate wherein several cavities are produced using glass ceramic green sheets that were punched and personalized with the alumina type green sheet. This provided cavities of varying depths and clearly illustrates the scope of the instant invention. In addition, a contact sheet was punched with the same shape and filled with a glass/ceramic green sheet. This in turn formed a raised glass ceramic structure that could be used for bonding a hat, etc. or other structure to the substrate. The formation of the various structures can serve as chip cavities, grooves for seals, such as an O-ring, etc.

Metal Green Sheet Disclosures Metallurgical Green Sheet

Personalization of a ceramic green sheet without causing dimensional instabilities and the formation of unique sinterable metal structures using metallurgical green sheets are possible in accordance with this invention.

This invention deals with the formation of a special green sheet that is composed of metal powder that is dispersed in an organic binder forming a cast metallurgical green sheet, which is analogous to a green ceramic material in that it is composed of particles of metal suspended in an organic binder forming the green sheet. The organic binder is a labile material, which once decomposed permits the sintering of the metal powder which remains. The sintering causes the metal powder to approach the theoretical density of the solid metal. The first green sheets formed were cast in thickness from 50–400 μm and used for transfer personalization, lamination personalization, microtome personalization and overall metallurgical studies associated with providing a solid continuous layer of metallurgical material.

This formulation is as follows:

| | Wt % | Range (Wt. %) |
|---|---|---|
| Molybdenum (2.8 micron average particle size) | 80.5 | 70.0–90.0 |
| Polyvinylbutyral (Butvar B-98) | 2.0 | 1.0–6.0 |
| Benzoflex 9-88* | .7 | .7–3.0 |
| Methanol | 4.2 | 1.5–25.0 |
| Methlyisobutylketone | 12.6 | 1.5–25.0 |

*Benzoflex comprises dipropylene glycol dibenzoate.

The metallurgical green sheet provides the ability to adjust the sheet properties in order to control density, shrinkage, and shrinkage control of the metallurgy. One of the most significant attributes of the metallurgical green sheet is its use as a solventless method of personalizing ceramic green sheets using transfer and microtome personalization.

The metallurgical sheet is also essential in fabrication of a multilayer lamination and sintering technique employed in the fabrication of a laminated heat sink.

This invention can also be employed with the formation of copper particulate greensheets consisting of standard copper powder dispersed in a polymethyl methacrylate plasticized binder system. This forms a green sheet composed of a standard metallurgical powder. This approach can be used for generating green sheet for application with numerous metallurgies and alloys. Metals and alloys of copper, gold, silver, lead, tin, bismuth, indium, palladium, molybdenum, tungsten, platinum, nickel, etc. can be employed.

Polyvinylbutyral and PMMA have been used to provide metallurgical green sheets but is not limited to these materials. Binders consisting of acrylates, methacrylates, polyether, vinyls, vinyl alcohol, polycarbonates, polymethyl acrylic acid, etc. can also be employed.

The slurries consisting of metal particulates, usually with an average particle size of 3 μm, the polymeric binder, a plasticizer and solvent form a homogeneous dispersion that is cast using a doctor blade technique. Each polymer that is incorporated, utilize solvents and non-solvent mixtures that provide the appropriate evaporation rates and sheet formation properties. The selection of the solvent system are quite broad but must be precisely formulated to control the exact green sheet microporous structure desired.

| PMMA/Copper Green sheet Formulation | | | |
|---|---|---|---|
| Materials | Wt. in Grams | Wt % | Range (Wt %) |
| Copper Powder | 3366.0 | 82.6 | 70–90 |
| PMMA(Acryloid A-11) | 150.0 | 3.7 | 2–8 |
| Benzoflex 9-88 | 76.6 | 1.9 | 1–4 |
| Acetone | 288.0 | 7.1 | 3–12 |
| Ethanol | 192.0 | 4.7 | 3–12 |

1. The formation of a special metallurgical green sheet comprising metal particles in a matrix of organic binder providing a well defined and controlled microporous structure employed as a solventless green sheet personalization technique for the fabrication of MLC heat sink, transfer and microtome personalization, etc.

2. Metallurgical green sheets that are continuous cast from a slurry consisting of metallurgical particulates normally employed as wiring in semiconductor packaging. These are formed in very homogeneous and controlled layers.

3. Metals used for conductors, interconnection, including e. g. copper, molybdenum, tungsten, silver, gold, nickel, tin, lead, indium, bismuth and alloys of these.

4. Polymers comprising those normally used for green sheet casting vinyl butyrals, methacrylates, acrylates, polycarbonates, polyethers, acetates, polymethylacrylic acid, etc.

5. The selection of solvent and non-solvent having differential evaporation rate whose proportions can be varied to adjust green sheet microporosity via rheological or phase separation sheet formation mechanism.

6. Metallurgical green sheet used for construction of multilayer heat sinks, etc.

Multilayer Fabricated Heat Sink

The removal of heat from various sources of heat is an age old problem in many industries. In the electronic industry, heat sinks have always been employed to dissipate heat from semiconductor devices. These techniques always center around techniques of using material that have high thermal conductivities and high total surface areas. Finned aluminum has always been a prime candidate since it can be easily extruded. As higher thermal energies are generated it becomes an increasingly more difficult task to provide higher performance heat sinks, both for air and liquid cooled applications. This invention of an MLC heat sink provides a method to produce high surface areas heat sinks using an MLC fabrication technique.

Figure 9A:
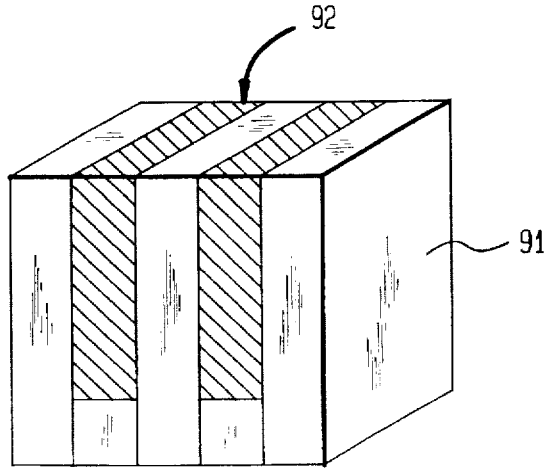
FIGS. 9A and 9B illustrate a basic design of a heat sink made by the multilayered ceramic (MLC) approach.
Figure 9B:
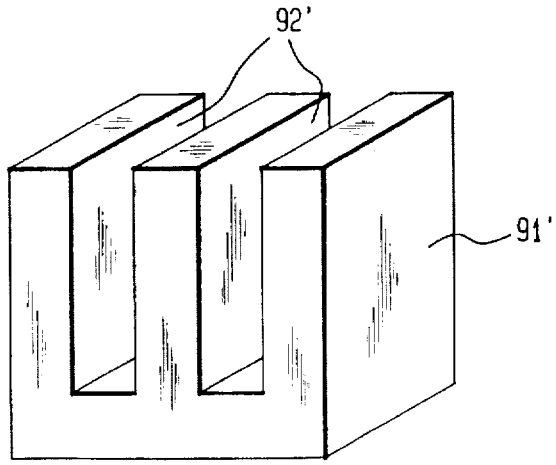

The MLC heat sink is fabricated using current MLC technology with special metallurgical green sheets in, conjunction with a non sinterable green sheet. The desired MLC structure is produced by laminating metallurgical green sheets and the non-sinterable layers into the desired configuration. FIGS. 9A and 9B illustrate a basic design of a heat sink made by the MLC approach, but the MLC approach clearly allows the fabrication, of very complex shapes and contours to achieve special cooling effects or passageways.

The various metallurgical layers 91 are placed and aligned with the non-sinterable layers 92 and the two laminated. These laminated structures are then sintered. The non-sintering layers 92 support and isolate the metal layers 91 in the desired areas, forming a final heat sink composed of the transformed layers 91'. Referring to FIG. 9B, following sintering, the unsintered material in spaces 92' is removed. This can usually be achieved using ultrasonic, high pressure fluids, etc.

With integral shapes, the use of higher contents of the labile binder or organic material in the non-sinterable material provides shrinkage to the non-sinterable phase to minimize or eliminate distortion as the sinterable material shrinks during sintering. The inclusion of such binder, etc. provides shrinkage similar to what is experienced in the sintering metal. Where applicable, the use of post sintering removable inserts as described earlier can also be used.

Figure 10:
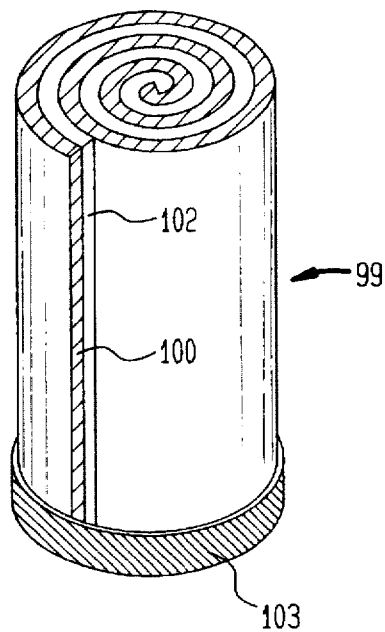
FIG. 10 shows a spiral heat sink structure made by wrapping two layers of material comprising metallurgical ceramic material and non-sintering material in a spiral form factor and laminating to the base conductor composed of similar metallurgical ceramic material.

The shape of the heat sink or metal structure is limitless, and is bound only by the way of fabricating different segments. A spiral heat sink structure 99 as shown in FIG. 10 is achieved by wrapping two layers of material comprising metallurgical material 100 and non-sintering material 102 in a spiral form factor and laminating to the base conductor 103 composed of similar metallurgical material. The non-sintering material 102 is removed after sintering.

Figure 11A:
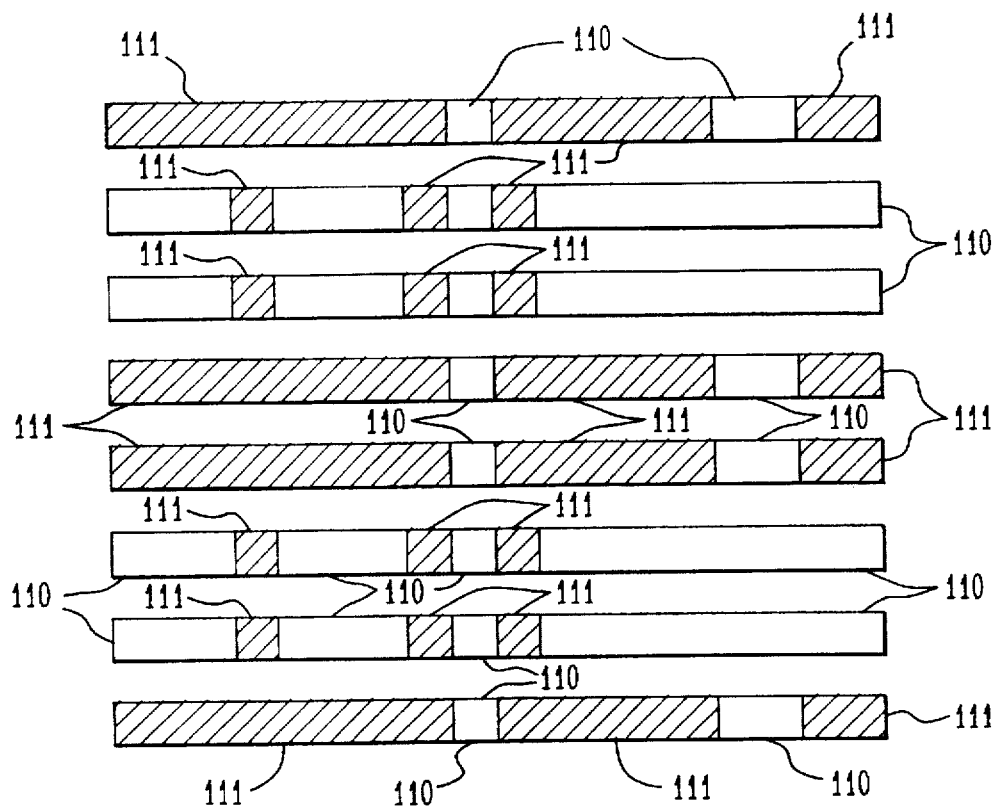
FIG. 11A and FIGS. 11B show how sintering of thin layers of non-sintering green layers with sinterable green metal layers to provide supporting studs insures proper spacing in metallic structures. Air or liquid passages are provided in the reverse manner in the metallurgical layer by personalizing that layer with a non-sintering element.
Figure 11B:
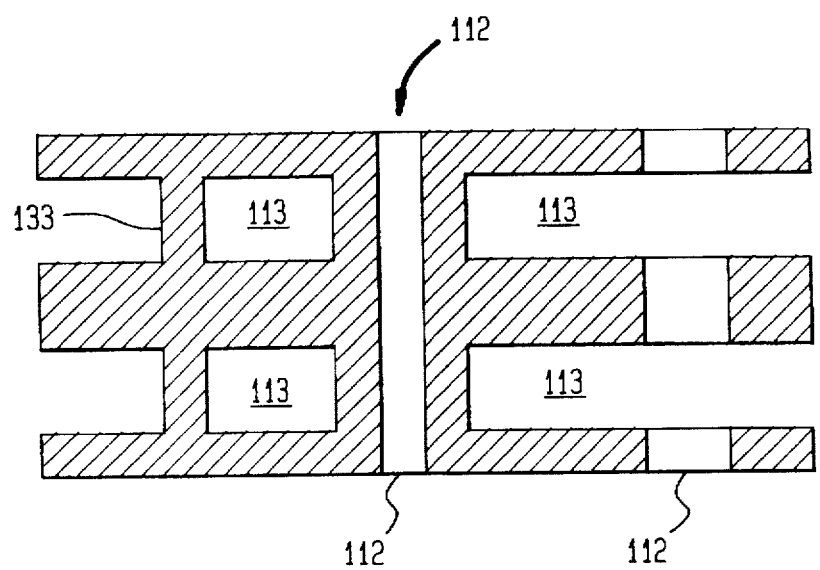

The major advantage of the sintered MLC heat sink is its ease of fabrication, particularly the formation of a thin section that requires close spacing. It offers a means of supporting thin layers by providing supporting studs that insure proper spacing. This can be achieved by personalizing the non-sintering layers with metal structures. Special air or liquid passages can be provided in the reverse manner in the metallurgical layer by personalizing that layer with a non-sintering element. This is illustrated in FIGS. 11A and 11B. FIG. 11A shows various personalized green sheet structures and FIG. 11B shows a sintered structure post lamination and sintering based on the structures shown in FIG. 11A. The nonsintering green ceramic material 110 is removed from the metallurgical material 111, in the usual way subsequent to lamination and firing, leaving coolant channels 112 and voids 113 where coolant can pass through. The metallic laminations form supports 133, from the corresponding metallurgical 111.

Figure 12A:
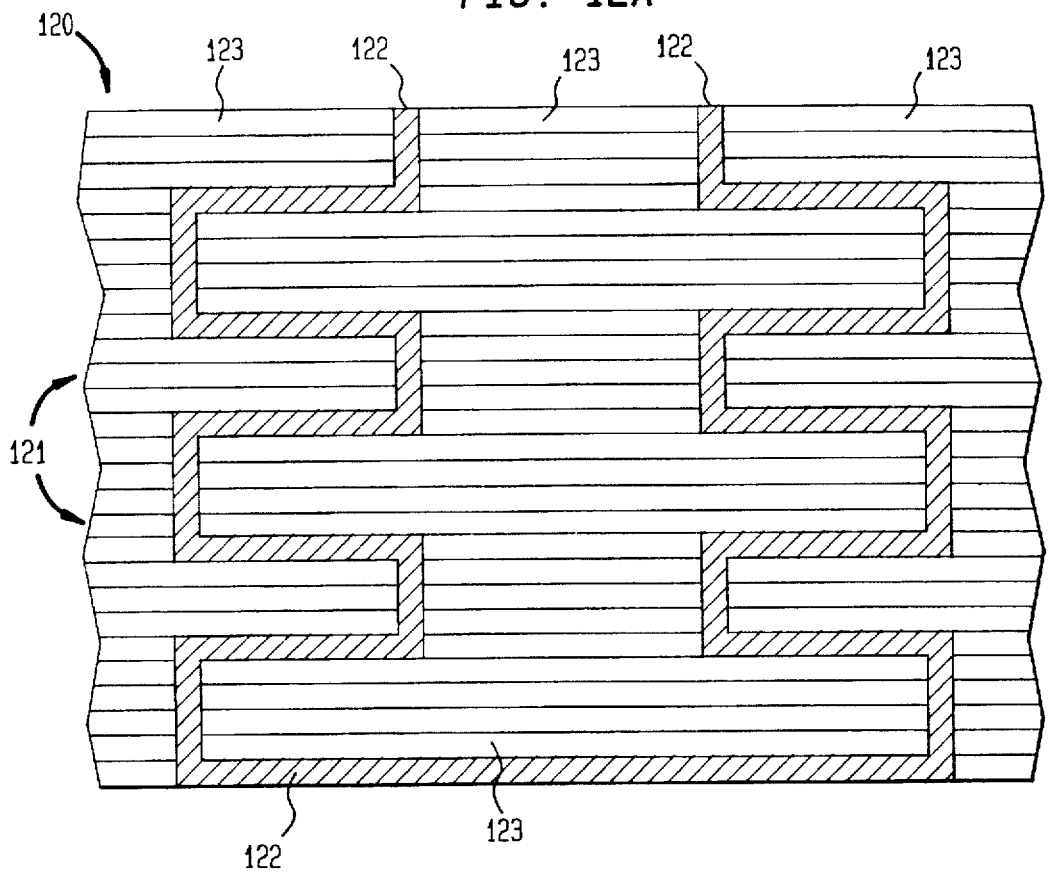
FIGS. 12A shows a stack of mixed composition green sheets personalized with the appropriate non-sinterable regions and sinterable metal regions.
Figure 12B:
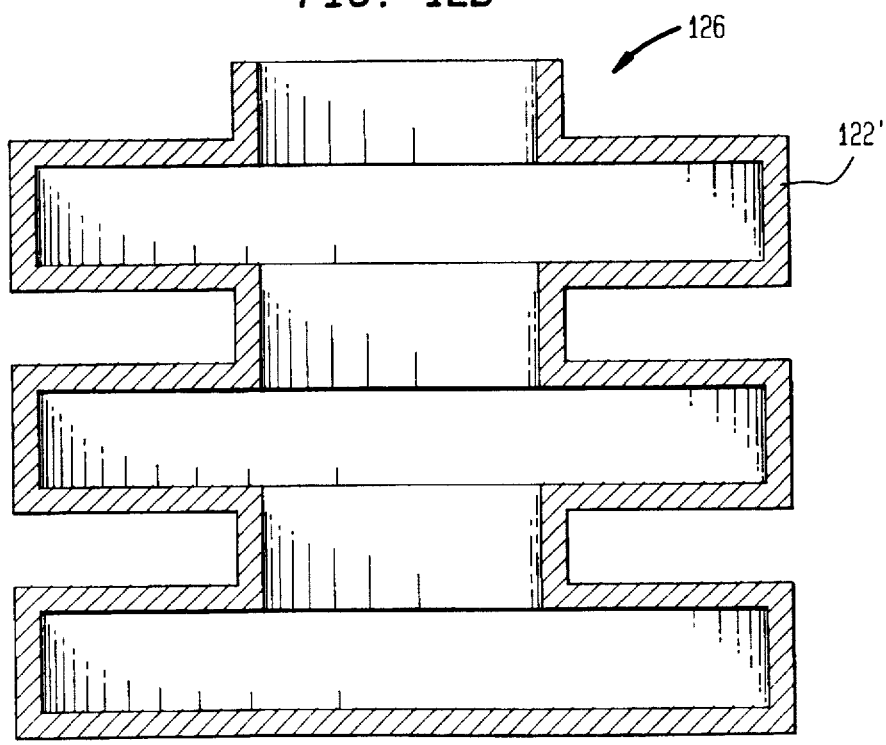
FIG. 12B shows that when laminated and sintered the stack in FIG. 12A will provide a metallic cylindrical bellows.

FIGS. 12A shows a stack 120 of mixed composition green sheets 121 that have been personalized with the appropriate regions of non-sinterable green material 123 and regions of sinterable green metal 122 and FIG. 12B shows that when laminated and sintered the stack in FIG. 12A will provide the metallic cylindrical bellows 126 composed of metal 122' shown in FIG. 12B. The nonsinterable portions 123 of the sheets 121 is removed in the manner described above. This further illustrates the wide range of shapes that can be produced. The bellows 126 could be easily fabricated with holes in the bellows 126 to allow for the passage of a cooling medium. The degree of design freedom is limited only to the scope of processing parameters and green sheet personalization whether ceramic or metal.

The sinterable regions 122 of sheets 121 can consist of a metal such as copper, gold, etc. and alloys of various highly conductive metals. This process can also be used to form special shapes from ceramic material where sinterable and non-sinterable segments are employed.

The non-sinterable materials can consist of any materials that have a higher sintering temperature than the material that it is cofired with and will not wet or sinter with. As an example copper as the sinterable material 122 with alumina as the non-sinterable material 123 can be used.

Summary of features of Multilayer Fabricated Heat Sinks

1. A multilayer fabricated heat sink is composed of a composite green sheet of both a sinterable metal particle and a second green material in sheet or partial sheet form that is deemed non-sinterable at the particular temperature at which the metal sinters. The non-sinterable material is a ceramic such as alumina. This MLC heat sink with these sinterable and non-sinterable layers provides high surface area metal structure for the purpose of high heat dissipation.

2. The fabrication of a structure of sinterable layers consists of highly conductive metals with interleaved layers of a non-sinterable material that is removed following the densification of the metal structure, providing complex high surface areas for maximum heat dissipation.

3. The metal or ceramic green sheet is personalized with a non-sinterable or sinterable material respectively in order to form passages or conductive supporting sections between adjacent layers.

4. The sinterable materials are any metal or ceramic that will provide the desired thermal conduction properties for the required applications, but preferably is one of maximum conductivity to facilitate ultimate cooling. Metals such as copper are preferred for maximum cooling and other materials are suitable for the thermally less demanding heat sink structures.

5. The non-sinterable is phase normally a ceramic that is deemed non-sinterable for this application as its sintering temperature is substantially above the material that is being sintered (e.g. alumina and copper.)

General Summary

1. Use a non-sinterable mold blank material easily removable following sintering by agitation and dispersal.

A. A mold blank of a non-sinterable material such as alumina is placed in locations in the package where each cavity is required.

(i) The mold blank can be in the form of a sheet, a strip of material, a fragment of material, or a solid block or a screenable paste.

(ii) Alternative mold blank materials include alumina (aluminum oxide), silicon nitride, boron nitride, aluminum nitride, tungsten, molybdenum, etc. The mold blank material is a higher temperature sintering material than the usual ceramic composition. In fact it can be ultra pure alumina material. One can employ materials that are high temperature refractory materials such as magnesium oxide (MgO), zirconium boride (ZrB), tungsten boride (WB), tungsten carbide (WC), and thorium oxide (Tho), to mention a few materials which can be employed. The higher temperature sintering materials can be used both for high and low temperature sintering ceramics and metals.

B. The non-sintered mold blank material (alumina, etc.) is then removed subsequently. In the case of alumina, placing the package in water causes the aluminum oxide to flake off and lie suspended in the water. Agitation of the water facilitates removal of the fragments of the mold blank. Following sintering the mold blank material is removed by impingment with water, etc. and/or ultrasonic agitation during suspension in a dispersant such as water.

2. In a practical application, the mold blanks are formed of green sheets of pure aluminum oxide which are laminated with layers of glass ceramic material as shown in FIGS. 2A–2D to form cavities and raised features as shown in FIG. 2D. The mold blanks can be shaped by punching, laser or E-beam machining of a ceramic material and then filling it with the mold blank material where the ceramic has been removed.

3. Hollow spaces 33 and 34 within a structure can be formed as in FIGS. 3A and 3B. Subsequently the hollow space 33 can be filled with polymeric material to form an optical transmission path.

4. Conductors can be formed by pressing the pattern of the circuit in the form of a mold blank into the surface of a green glass ceramic sheet and then firing and later adding the metallization where the mold blank has been removed in accordance with this invention. Then the metal is deposited and the surplus is removed by a conventional planarization technique.

5. Patterns can be formed to be snapped apart by placing the mold blank material into the glass ceramic material in broken line fashion so that the pattern produced will provide a fracture line with faults permitting a straight line snapping of the fired ceramic material to permit the laminate to be broken into individual parts following sintering. By using a non-sinterable material to define a cavity one provides a supporting structure that guarantees the shape and size of the desired cavity. The non-sinterable material remains during the entire sintering process and is only removed once the entire ceramic structure is totally sintered. The non-sinterable patterning technique is applicable to all ceramic materials, but is particularly advantageous where pressure sintering is used as in the case of glass/ceramic or even flattening of other ceramic structures where viscous flow occurs during sintering.

The method of this invention is applicable to numerous kinds of ceramic bodies and to powder metallurgy.

While this invention has been described in terms of the above embodiment(s), those skilled in the art will recognize that the invention can be practiced with modifications within the spirit and scope of the appended claims.

Having thus described the invention, what is claimed as new and desirable and desired to be secured by Letters Patent is as follows:

1. A method of forming a sintered structure with an insitu mold comprising:
   (a) forming at least one layer comprising of at least one first material and at least one second material, wherein said at least one second material does not fuse into said at least one first material and wherein the sintering temperature of said at least one second material is higher than the sintering temperature of said at least one first material,
   (b) sintering said first material and said second material to the sintering temperature of said at least one first material,
   (c) cooling said sintered first material and said second material, such that said first material forms an insitu mold, and
   (d) removing said at least one second material, and thereby forming said sintered structure with said at least one first material.

2. The method of claim 1, wherein said at least one first material is selected from a group consisting of green ceramic material, ceramic glass material, metallurgical powdered material, powdered material or powdered ceramic material.

3. The method of claim 2, wherein said powdered material includes a binder selected from a group consisting of acrylates, methacrylates, polyether, vinyls, vinyl alcohol, polycarbonates or polymethyl acrylic acid.

4. The method of claim 1, wherein said at least one second material is selected from a group consisting of alumina (aluminum oxide), aluminum nitride, boron nitride, magnesium oxide (MgO), molybdenum, silicon nitride, thorium oxide (ThO), tungsten, tungsten boride (WB), tungsten carbide (WC) or zirconium boride (ZrB).

5. The method of claim 1, wherein said at least one layer has at least one blind hole, and wherein said at least one second material is placed inside said at least one blind hole.

6. The method of claim 1, wherein at least a portion of said at least one layer is formed into a spiral shape prior to said sintering.

7. The method of claim 1, wherein said at least one layer has at least one opening, and wherein said at least one second material is inside said at least one opening.

8. The method of claim 1, wherein at least one wave guide material fills at least a portion of said sintered structure.

9. A method of forming a sintered structure from a powdered material using an insitu mold comprising:
   (a) forming a structure with at least one first material and at least one second material, wherein said first material is a powdered material, and wherein said at least one second material does not fuse into said at least one first material and wherein the sintering temperature of said at least one second material is higher than the sintering temperature of said at least one first material,
   (b) sintering said first material and said second material to the sintering temperature of said at least one first material,
   (c) cooling said sintered first material and said second material, such that said first material forms an insitu mold, and
   (d) removing said at least one second material, and thereby forming said sintered structure with said at least one first material.

10. The method of claim 9, wherein said first material is at least one green powdered material.

11. The method of claim 10, wherein said first material is selected from a group consisting of alumina (aluminum oxide), aluminum nitride, boron nitride, magnesium oxide (MgO), molybdenum, silicon nitride, thorium oxide (ThO), tungsten, tungsten boride (WB), tungsten carbide (WC) or zirconium boride (ZrB).

12. The method of claim 9, wherein said first material is selected from a group consisting of alumina (aluminum oxide), aluminum nitride, boron nitride, magnesium oxide (MgO), molybdenum, silicon nitride, thorium oxide (ThO), tungsten, tungsten boride (WB), tungsten carbide (WC) or zirconium boride (ZrB).

13. The method of claim 9, wherein line grooves are formed by pressing non-sinterable lines into said first material.

14. The method of claim 9, wherein line grooves are formed into said first material and wherein said grooves are filled with a non-sinterable paste.

15. The method of claim 14, further includes removing said preformed insitu mold material from said fired powdered material, and fracturing said fired material along said line grooves.

16. The method of claim 9, wherein at least one wave guide material fills at least a portion of said sintered structure.

17. A method of forming a sintered structure from a green glass ceramic material using an insitu mold comprising:
   (a) forming a structure with at least one first material and at least one second material, wherein said first material is a green glass ceramic material, and wherein said at least one second material does not fuse into said at least one first material and wherein the sintering temperature of said at least one second material is higher than the sintering temperature of said at least one first material,
   (b) sintering said first material and said second material to the sintering temperature of said at least one first material,
   (c) cooling said sintered first material and said second material, such that said first material forms an insitu mold, and
   (d) removing said at least one second material, and thereby forming said sintered structure with said at least one first material.

18. The method of claim 17, wherein said first material is selected from a group consisting of alumina (aluminum oxide), aluminum nitride, boron nitride, magnesium oxide (MgO), molybdenum, silicon nitride, thorium oxide (ThO), tungsten, tungsten boride (WB), tungsten carbide (WC) or zirconium boride (ZrB).

19. A method of forming a sintered structure from a green metallurgical powdered material using an insitu mold comprising:

(a) forming a structure with at least one first material and at least one second material, wherein said first material is a green metallurgical powdered material, and wherein said at least one second material does not fuse into said at least one first material and wherein the sintering temperature of said at least one second material is higher than the sintering temperature of said at least one first material, (b) sintering said first material and said second material to the sintering temperature of said at least one first material, (c) cooling said sintered first material and said second material, such that said first material forms an insitu mold, and (d) removing said at least one second material, and thereby forming said sintered structure with said at least one first material.

20. The method of claim 19, wherein said metallurgical powder is selected from a group consisting of bismuth, copper, gold, indium, lead, molybdenum, nickel, palladium, platinum, silver, tin, tungsten or alloys thereof.

21. The method of claim 19, wherein said powdered material includes a binder selected from the group consisting of acrylates, methacrylates, polyether, vinyls, vinyl alcohol, polycarbonates, and polymethyl acrylic acid.

22. The method of claim 19, wherein said metallurgical material is composed in its green form of

|  | Wt. % | Range (Wt. %) |
|---|---|---|
| 2.8 Molybdenum | 80.5 | 70.0–90.0 |
| Polyvinylbutyral | 2.0 | 1.0–6.0 |
| Dipropylene gylcol dibenzoate | 0.7 | 0.7–3.0 |
| Methanol | 4.2 | 1.5–25.0 |
| Methlyisobutylketone | 12.6 | 1.5–25.0. |

23. The method of claim 19, wherein said metallurgical material is composed in its green form of

| PMMA/Copper Green sheet Formulation | | | |
|---|---|---|---|
| Materials | Wt. Grams | Wt. % | Range (Wt. %) |
| Copper Powder | 3366.0 | 82.6 | 70–90 |
| PMMA(Acryloid A-11) | 150.0 | 3.7 | 2–8 |
| Dipropylene gylcol dibenzoate | 76.6 | 1.9 | 1–4 |
| Acetone | 288.0 | 7.1 | 3–12 |
| Ethanol | 192.0 | 4.7 | 3–12. |

24. A method of forming a sintered structure with an insitu mold comprising:

(a) forming at least one layer comprising of at least one first material and at least one second material, wherein said at least one second material does not fuse into said at least one first material and wherein the sintering temperature of said at least one second material is higher than the sintering temperature of said at least one first material, (b) providing fracture markings in said first material to serve as a fracture point on a snap laminate format and broken into individual parts following sintering, (c) sintering said first material and said second material to the sintering temperature of said at least one first material, (d) cooling said sintered first material and said second material, such that said first material forms an insitu mold, and (e) removing said at least one second material, and thereby forming said sintered structure with said at least one first material.

25. The method of claim 24, further including fracturing said sintered first material along said fracture markings.

26. A method of forming a sintered structure with an insitu mold comprising:

(a) forming at least one layer comprising of at least one first material and at least one second material, wherein said at least one second material does not fuse into said at least one first material and wherein the sintering temperature of said at least one second material is higher than the sintering temperature of said at least one first material, (b) providing at least one opening in said first material, (c) providing a preformed insert composed of substantially identical material to said first material and inserting said insert into said opening, (d) sintering said first material and said second material to the sintering temperature of said at least one first material, (e) cooling said sintered first material and said second material, such that said first material forms an insitu mold, and (f) removing said at least one second material, and thereby forming said sintered structure with said at least one first material.

27. The method of claim 26, wherein a release layer consisting of a screened paste is deposited on the top surface of said insert.

28. A product made by the method of claim 1, wherein said product has at least one laminated layer that has been sintered.

29. A product made by the method of claim 1, wherein said product has at least one hollow space and wherein at least a portion of said hollow space is used to house at least one wave guide material.

30. A product made by the method of claim 1, wherein the material for said product is selected from a group consisting of bismuth, copper, gold, indium, lead, molybdenum, nickel, palladium, platinum, silver, tin, tungsten or alloys thereof.

31. A product made by the method of claim 1, wherein the material for said product is selected from a group consisting of alumina (aluminum oxide), aluminum nitride, boron nitride, magnesium oxide (MgO), molybdenum, silicon nitride, thorium oxide (ThO), tungsten, tungsten boride (WB), tungsten carbide (WC) or zirconium boride (ZrB).

32. A product made by the method of claim 9, wherein said product has at least one laminated layer that has been sintered.

33. A product made by the method of claim 9, wherein said product has at least one hollow space and wherein at least a portion of said hollow space is used to house at least one wave guide material.

34. A product made by the method of claim 9, wherein the material for said product is selected from a group consisting of bismuth, copper, gold, indium, lead, molybdenum, nickel, palladium, platinum, silver, tin, tungsten or alloys thereof.

35. A product made by the method of claim 9, wherein the material for said product is selected from a group consisting of alumina (aluminum oxide), aluminum nitride, boron nitride, magnesium oxide (MgO), molybdenum, silicon nitride, thorium oxide (ThO), tungsten, tungsten boride (WB), tungsten carbide (WC) or zirconium boride (ZrB).

36. A product made by the method of claim 19, wherein said product has at least one laminated layer that has been sintered.

37. A product made by the method of claim 19, wherein said product has at least one hollow space and wherein at least a portion of said hollow space is used to house at least one wave guide material.

38. A product made by the method of claim 19, wherein the material for said product is selected from a group consisting of bismuth, copper, gold, indium, lead, molybdenum, nickel, palladium, platinum, silver, tin, tungsten or alloys thereof.

39. A product made by the method of claim 19, wherein the material for said product is selected from a group consisting of alumina (aluminum oxide), aluminum nitride, boron nitride, magnesium oxide (MgO), molybdenum, silicon nitride, thorium oxide (ThO), tungsten, tungsten boride (WB), tungsten carbide (WC) or zirconium boride (ZrB).

* * * * *